United States Patent [19]

Faith, Jr. et al.

[11] Patent Number: 4,457,976

[45] Date of Patent: Jul. 3, 1984

[54] METHOD FOR MOUNTING A SAPPHIRE CHIP ON A METAL BASE AND ARTICLE PRODUCED THEREBY

[75] Inventors: Thomas J. Faith, Jr., Lawrenceville; Robert S. Irven, Belle Mead, both of N.J.; Sabrina K. Plante, Arlington, Va.

[73] Assignee: RCA Corporation, New York, N.Y.

[21] Appl. No.: 479,518

[22] Filed: Mar. 28, 1983

[51] Int. Cl.³ .................. B32B 15/04; B23K 31/02
[52] U.S. Cl. ............................ 428/457; 228/123; 428/447; 428/689
[58] Field of Search .................. 428/457, 447, 689; 228/123, 205, 121

[56] References Cited

U.S. PATENT DOCUMENTS

| 3,680,196 | 8/1972 | Leinkram | 228/123 |
| 3,918,144 | 11/1975 | Mimata et al. | 228/205 |
| 4,018,374 | 4/1977 | Lee et al. | 228/121 |
| 4,078,711 | 3/1978 | Bell et al. | 228/123 |
| 4,181,249 | 1/1980 | Peterson et al. | 228/121 |

Primary Examiner—Thomas J. Herbert, Jr.
Attorney, Agent, or Firm—Birgit E. Morris; Donald S. Cohen

[57] ABSTRACT

A sapphire chip is bonded to a metal substrate by means of an intermediate layer of 98% by weight of gold and 2% by weight of silicon. The intermediate layer directly contacts and is bonded to a bare, uncoated surface of the sapphire chip and a surface of the substrate.

8 Claims, 1 Drawing Figure

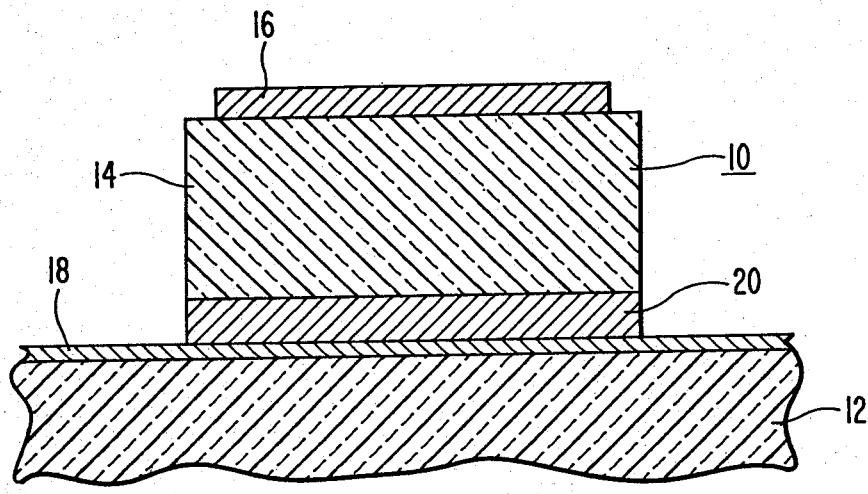

METHOD FOR MOUNTING A SAPPHIRE CHIP ON A METAL BASE AND ARTICLE PRODUCED THEREBY

BACKGROUND OF THE INVENTION

The present invention relates to a method of mounting a sapphire chip on a metal base and the article produced thereby. More particularly, the present invention relates to a semiconductor device which is a silicon-on-sapphire chip mounted on a metal support of a package and a method of making the same.

In the semiconductor industry, it is a common practice to mount chips of semiconductor material, such as single crystal silicon, on the metal support of the package by placing a metal preform between the back surface of the semiconductor chip and the metal support. The assembly is then heated to the softening temperature of the chip-preform interface, i.e. the eutectic temperature, in a reducing atmosphere, such as forming gas. The chip, while heated, is gently scrubbed, i.e. moved back-and-forth, either manually with tweezers or automatically in a collet, to break the native oxide on the surface of the chip and to promote melting at the interface of the chip and the preform and the bonding of the metal of the preform to the chip and the metal support. However, for mounting a type of semiconductor device known as a silicon-on-sapphire device, which consists of circuit elements formed in islands of single crystal silicon on a sapphire substrate, this type of mounting has been used only if the back surface of the sapphite substrate was coated with a material to which the material of the preform would adhere well. For example, U.S. Pat. No. 4,078,711 to H. A. Bell et al., issued Mar. 14, 1978, entitled, METALLURGICAL METHOD FOR DIE ATTACHING SILICON ON SAPPHIRE DEVICES TO OBTAIN HEAT RESISTANT BOND, describes coating the back surface of the sapphire substrate with a layer of tungsten covered by a layer of gold. U.S. Pat. No. 4,181,249 to H. T. Peterson et al., issued Jan. 1, 1980, entitled, EUTECTIC DIE ATTACHMENT METHOD FOR INTEGRATED CIRCUITS, describes coating the back surface of the sapphire substrate with silicon. The purpose of this coating is to provide an interface with the preform material which will promote low temperature, i.e. eutectic, melting. For example, if using a preform of gold-silicon mixture, melting will start to occur at the interface of either a gold-silicon preform and gold coating or a gold-silicon preform and silicon coating at about 363° C., the eutectic temperature of the gold-silicon binary mixture. By comparison, the melting temperatures of the individual constituents, gold and silicon, are 1063° C. and 1414° C. respectively. However, using a back surface film on the sapphire to achieve good bonding to the preform material adds to the complexity and cost of the processing of the silicon-on-sapphire devices. Silicon-on-sapphire devices are alternatively mounted on the package by means of an epoxy plastic bonding material. However, plastic bonds are not as satisfactory as eutectic bonds because of the lower melting temperature of the plastic materials used and because the plastic often emits elements which can contaminate the packaged semiconductor device.

SUMMARY OF THE INVENTION

A sapphire chip is mounted on a metal member by means of an intermediate bonding layer of a gold-silicon eutectic. The mounting is made by placing a preform of the gold-silicon eutectic between and in direct contact with the bare surface of the sapphire chip and the metal member and heating the assembly to the softening temperature of the preform in a reducing atmosphere. This provides a suitable bond between the sapphire chip and the metal member.

BRIEF DESCRIPTION OF DRAWING

The FIGURE of the drawing is a sectional view of a silicon-on-sapphire semiconductor device mounted on a support member in accordance with the present invention.

DETAILED DESCRIPTION OF PREFERRED EMBODIMENT

Referring to the drawing, there is shown a silicon-on-sapphire device, generally designated as 10, mounted on a support member 12. The silicon-on-sapphire device 10 includes a sapphire chip 14 having a plurality of islands 16 of single crystal silicon on the front surface thereof. Semiconductor elements forming the active portion of the semiconductor device 10 are formed in the silicon island 16. The support member 12, which is shown to be of an insulating material, such as ceramic, has a thin layer 18 of a metal, such as gold, on a surface thereof. However, if desired, the entire support member 12 can be made of a suitable metal. A bonding layer 20 is between the sapphire chip 14 and the metal layer 18. The bonding layer 20 is in direct contact with both the bare surface of the sapphire chip 14 and the metal layer 18 and secures the sapphire chip 14 to the support 12. The bonding layer 20 is of a gold-silicon mixture which contains up to several percent by weight of the silicon.

To assemble the semiconductor device 10 on the support 12, a preform of the gold-silicon mixture is placed between and in direct contact with the bare, uncoated back surface of the sapphire chip 14 and the metal layer 18 on the support 12. The assembly is placed in a reducing atmosphere, such as forming gas, and heated to a temperature above the eutectic temperature of the preform, i.e. to between about 400° C. and 445° C. While the assembly is being heated, the sapphire chip 14 is scrubbed on the preform. To scrub the sapphire chip 14, it is pressed against the preform and moved laterally back and forth across the preform. The scrubbing is carried out until the preform melts and wets both the surface of the sapphire chip 14 and the metal layer 18. The scrubbing can be carried out manually by means of tweezers or can be carried out automatically in a commercial bonder which includes a chuck for holding the sapphire chip 14 and moving it back and forth across the preform. After the preform melts and wets the surfaces of the sapphire chip 14 and the metal layer 18, thereby forming the bonding layer 20, the scrubbing is stopped and the assembly is cooled to harden the bonding layer 20 and thereby bond the semiconductor device 10 to the support 12. We have found that by using the metal layer of the gold-silicon mixture, the sapphire chip 14 is bonded to the support 12 by a metal bond which is satisfactory in that it passes the various standard tests for bonding a semiconductor device to a support.

The following examples are given to further illustrate the present invention and are not to be taken in any way as restricting the invention beyond the scope of the appended claims.

EXAMPLE I

A group of sapphire test chips were mounted on substrates in accordance with the method of the present invention. The substrates were gold plated. The sapphire chips used were rectangular in shape and of two different sizes. One size was 0.14 inch by 0.18 inch and the other size was 0.21 inch by 0.21 inch. Preforms of 98% by weight of gold and 2% by weight of silicon were used with the preforms being of a size of 0.15 inch by 0.15 inch by 0.001 inch. The sapphire chips had one smooth surface and one rough surface. For some tests, the bonding was to the rough surface and for others to the smooth surface.

Two mounting methods were used, tweezer mounting and collet mounting. For tweezer mounting, the chip mounting fixture was a Corning PC 100 hotplate with a 0.5 inch aluminum plate on top. At one corner of the plate was a finger onto which the substrates fitted tightly. Forming gas was flowed across the top surface of the substrate at the rate of 10 standard cubic feet per hour (SCFH). The substrate was heated to a temperature of 410±10° C. and the temperature was monitored by a thermocouple attached to the underside of the mounting finger. A preform was placed on the substrate and a sapphire chip was held on the preform by means of tweezers. The sapphire chip was pressed against the preform by a glass rod. While the assembly of the substrate, preform and sapphire chip was being heated, the sapphire chip was scrubbed across the preform by means of the tweezers. This was carried out until the preform flowed to bond the sapphire chip to the substrate.

For collet mounting, a K & S 642 bonder was used. The gold coated substrates were mounted on a stage of the bonder and were heated to a temperature of between 400° C. and 445° C. A preform was mounted on the substrate and the sapphire chip was mounted in a collet. The sapphire chip was pressed against the preform at a force of between 80 grams and 165 grams. Forming gas was flowed over the assembly at a rate of 4.5 SCFH. The sapphire chip was scrubbed over the preform at a rate of 60 Hz with an amplitude of about 2 mils.

After the sapphire chips were mounted on the substrates, the assemblies were subjected to various tests. These tests included thermal shock tests where the assemblies were transferred from hot to cold, constant acceleration tests, mechanical shock tests, vibration tests, die shear strength, and drop test. Also, for some of the devices, the hot sapphire chip was pulled off of the substrate and the back surface of the chip and substrate were inspected and measured for the chip area which was wetted by the preformed material. The following table shows the results of these tests with the first number being the number of the devices tested and the second number being the number failed.

TABLE I

| | |
|---|---|
| Thermal Shock | 20/0 |
| Constant Acceleration | 20/0 |
| Mechanical Shock & Vibration | 20/0 |
| Die Shear | 14/4 |
| Drop (Smooth surface sapphire) | 16/2 |
| Drop (Rough surface sapphire) | 16/1 |
| Mean Fraction Wetted (Smooth surface sapphire) | 0.55 |
| Mean Fraction Wetted (Rough surface sapphire) | 0.60 |

EXAMPLE II

A number of sapphire chips were mounted on gold coated substrates by the method set forth in Example I except that the preform used was of 95 weight percent of lead and 5 weight percent of tin with the dimensions of each preform being 0.17 by 0.09 by 0.002 inch. For tweezer mounting, the substrate was heated to a temperature of 340±10° C. and for collet mounting, the substrate was heated to a temperature of between 335° C. and 380° C. which was sufficient to melt the preform. The following table shows the results of the test performed on the devices made with this preform.

TABLE III

| | |
|---|---|
| Thermal Shock | 8/0 |
| Constant Acceleration | 8/0 |
| Mechanical Shock & Vibration | 8/2 |
| Die Shear | 5/5 |
| Drop | 22/32 |
| Mean Fraction Wetted | <0.1 |

Comparing Tables I and II, it can be seen that although devices made with both the gold silicon preforms and the lead-tin preforms suitably pass the thermal shock, constant acceleration and mechanical shock and vibration tests, the devices made with the lead-tin preforms completely failed the shear and drop tests whereas the devices made with the gold silicon preforms clearly pass these tests. The last results would be expected from the fact that the lead-tin wetted very little of the bare sapphire surface whereas the gold silicon wetted over half of the bare sapphire surface. Thus, although not all solder materials can be used to achieve a suitable bond between sapphire and a metal substrate, applicants have discovered that a gold silicon preform material will provide a suitable bond between a bare sapphire surface and a metal substrate so that the gold silicon preform material can be used to mount silicon-on-sapphire chips to a metal housing support.

We claim:

1. An assembly comprising:
   a metal substrate,
   a sapphire chip seated on a surface of said substrate, and
   a bonding layer of gold-silicon eutectic directly contacting and bonded to a surface of said substrate and a bare surface of said sapphire chip so as to secure said sapphire chip to said substrate.

2. An assembly in accordance with claim 1 wherein said gold-silicon eutectic contains 98% by weight of gold and 2% by weight of silicon.

3. An assembly in accordance with claim 2 wherein the said surface of the substrate is of gold.

4. A method of bonding a sapphire chip to a metal substrate comprising the steps of:
   placing a preform of a gold-silicon between and in direct contact with a bare, uncoated surface of said sapphire chip and a surface of said substrate, and
   heating said assembly until the preform flows and bonds to each of said sapphire chip and substrate.

5. A method in accordance with claim 4 in which the preform contains 98% by weight of gold and 2% by weight of silicon.

6. A method in accordance with claim 4 in which the assembly is heated to a temperature of between 400° C. and 445° C.

7. A method in accordance with claim 6 in which the sapphire chip is moved back and forth over the preform while the assembly is being heated.

8. A method in accordance with claim 2 in which the sapphire chip is pressed downwardly against the preform while it is being moved back and forth.

* * * * *

UNITED STATES PATENT AND TRADEMARK OFFICE
CERTIFICATE OF CORRECTION

PATENT NO. : 4,457,976

DATED : July 3, 1984

INVENTOR(S) : Thomas J. Faith, Jr. et al.

It is certified that error appears in the above-identified patent and that said Letters Patent is hereby corrected as shown below:

Column 1, line 31, change "sapphite" to --sapphire--.

Column 4, line 65, change "claim 2" to --claim 7--.

Signed and Sealed this

Sixth Day of November 1984

[SEAL]

Attest:

GERALD J. MOSSINGHOFF

*Attesting Officer*     *Commissioner of Patents and Trademarks*